United States Patent
Ono

(10) Patent No.: US 7,644,326 B2
(45) Date of Patent: Jan. 5, 2010

(54) TESTING SYSTEM AND TESTING SYSTEM CONTROL METHOD

(75) Inventor: Haruyoshi Ono, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 297 days.

(21) Appl. No.: 11/730,259

(22) Filed: Mar. 30, 2007

(65) Prior Publication Data

US 2007/0245189 A1 Oct. 18, 2007

(30) Foreign Application Priority Data

Mar. 31, 2006 (JP) ............................. 2006-101122

(51) Int. Cl.
*G01R 31/28* (2006.01)

(52) U.S. Cl. ..................................................... 714/724

(58) Field of Classification Search ................. 714/724; 324/753, 765

See application file for complete search history.

(56) References Cited

U.S. PATENT DOCUMENTS

| | | | | |
|---|---|---|---|---|
| 6,157,200 A | * | 12/2000 | Okayasu | 324/753 |
| 6,259,256 B1 | * | 7/2001 | Walling | 324/539 |
| 6,407,560 B1 | * | 6/2002 | Walraven et al. | 324/752 |
| 6,996,757 B2 | * | 2/2006 | Evans | 714/724 |
| 7,362,089 B2 | * | 4/2008 | Kushnick et al. | 324/158.1 |

FOREIGN PATENT DOCUMENTS

| | | |
|---|---|---|
| JP | 10-68753 A | 3/1998 |
| JP | 10-075248 A | 3/1998 |
| JP | 2004-023337 A | 1/2004 |

OTHER PUBLICATIONS

Office Action dated Sep. 1, 2009 issued in corresponding Japanese Patent Application 2006-101122.

* cited by examiner

*Primary Examiner*—James C Kerveros
(74) *Attorney, Agent, or Firm*—Westerman, Hattori, Daniels & Adrian, LLP

(57) ABSTRACT

A testing system includes a plurality of test applying portions and a plurality of testing portions, each test applying portion having a test device that generates an output signal and each testing portion tests the output signal of the test device, in response to the test applying portion. The testing system further includes a switch portion that switches the output signal of the test device between the test applying portions and the testing portions. The switch portion includes, a first switch having an input port and a plurality of output ports, which selects the output port for connecting the input port, a second switch having a plurality of input ports and an output port, which selects the input port for connecting the output port, and a connecting portion that has a plurality of transmission parts that connect the output ports of the first switch and the input ports of the second switch.

7 Claims, 11 Drawing Sheets

TEST ITEM LIST

| ORDER | TEST ITEM |
|---|---|
| 1 | TEST ITEM 1 |
| 2 | TEST ITEM 2 |
| 3 | TEST ITEM 3 |
| ⋮ | ⋮ |

TEST ITEM INFORMATION

| TESTING PORTION a | TESTING PORTION b | TESTING PORTION c |
|---|---|---|
| TEST ITEM 1 | TEST ITEM 1 | TEST ITEM 2 |
| TEST ITEM 2 | TEST ITEM 3 | TEST ITEM 4 |
| TEST ITEM 3 | TEST ITEM 4 | ⋮ |
| ⋮ | ⋮ | |

FIG. 8

TEST ORDER INFORMATION

TESTING PORTION a

| ORDER | TEST APPLYING PORTION | TEST ITEM |
|---|---|---|
| 1 | B | 1 |
| 2 | C | 1 |
| 3 | — | — |
| ⋮ | ⋮ | ⋮ |

TESTING PORTION b

| ORDER | TEST APPLYING PORTION | TEST ITEM |
|---|---|---|
| 1 | C | 4 |
| 2 | — | — |
| 3 | — | — |
| ⋮ | ⋮ | ⋮ |

FIG. 9

TESTING PORTION b

| ORDER | TEST APPLYING PORTION | TEST ITEM |
|---|---|---|
| 1 | C | 4 |
| 2 | A | 1 |
| 3 | — | — |
| ⋮ | ⋮ | ⋮ |

FIG. 10A

| ORDER | TEST APPLYING PORTION | TEST ITEM | TEST PRIORITY INFORMATION |
|---|---|---|---|
| 1 | A | 1 | HIGH PRIORITY |
| 2 | C | 4 | NORMAL |
| 3 | — | — | — |
| ⋮ | ⋮ | ⋮ | ⋮ |

FIG. 10B

| ORDER | TEST APPLYING PORTION | TEST ITEM | TEST PRIORITY INFORMATION |
|---|---|---|---|
| 1 | C | 4 | HIGH PRIORITY |
| 2 | A | 1 | HIGH PRIORITY |
| 3 | — | — | — |
| ⋮ | ⋮ | ⋮ | ⋮ |

FIG. 11

| STEP | TEST ITEM | TESTER | LINE | EACH PERIOD OF TIME (SECONDS) | TIME |
|---|---|---|---|---|---|
| S100 | TESTER | — | — | 30 | 30 |
| S101 | TEST ITEM 1 | TESTER A | L1 | 25 | 25 |
| S102 | TEST ITEM 2 | TESTER A | L1 | 65 | 65 |
| S103<br>S104 | TEST ITEM 3<br>TEST ITEM 4 | TESTER B<br>TESTER C | L21<br>L22 | 85<br>87 | 87 |
| S105 | TEST ITEM 5 | TESTER A | L1 | 30 | 30 |
| S106<br>S107<br>S108 | TEST ITEM 6<br>TEST ITEM 7<br>TEST ITEM 8 | TESTER B<br>TESTER C<br>TESTER D | L21<br>L22<br>L23 | 85<br>88<br>112 | 112 |
| | | TOTAL PERIOD OF TIME REQUIRED | | 607 | 349 |

TESTING SYSTEM AND TESTING SYSTEM CONTROL METHOD

BACKGROUND OF THE INVENTION

1. Field of the Invention

This invention generally relates to testing systems and testing system control-methods, and more particularly, to a testing system, testing system control method, and test apparatus, by which multiple test devices or elements to be tested are tested with multiple test apparatuses.

2. Description of the Related Art

Testing the test devices or elements to be tested, such as light emitting devices that emit optical signals such as, for example, semiconductor lasers or the like or semiconductor devices that emit electrical signals, is performed as described as follows. The power supply, signal generator, temperature controller, or the like applies voltage, current, signal, temperature, or the like on the test devices or elements such as, for example, the semiconductor lasers or semiconductor devices. The voltage, current, signal, temperature, or the like causes the test devices or elements to output test signals to be tested, such as the optical signals or electrical signals, respectively. A tester implements a test for a test item on the test device or element by use of the test signal to be tested. Hereinafter, a test applying portion includes: a power supply; a signal generator; a temperature controller; and a controller that controls them. A testing portion includes: a tester; and a controller that controls the tester.

As disclosed in Japanese Patent Application Publication No. 10-68753, electrical signals output from multiple test devices or elements are connected to multiple testers by a switch, and the testers implement tests by use of the electrical signals.

If the testers are physically at a distance from the objects to be tested in such a testing system, the testers physically located at a distance should preferably be used efficiently. Also, the testing time should preferably be shortened.

SUMMARY OF THE INVENTION

The present invention has been made in view of the above circumstances and provides a testing system that can shorten the testing time or efficiently use testers, and a method of controlling such a testing system.

According to one aspect of the present invention, there is provided a testing system including: a plurality of test applying portions that operate a test device to make an output signal from the test device; a plurality of testing portions that test the output of the test device; and a test applying portion having a test device to output a tested signal; and a switch portion that switches the output signal between the test applying portions and the testing portions, the switch portion including: (1) a first switch having an input port and a plurality of output ports, and selects the output port for connecting the input port; (2) a second switch having a plurality of input ports and an output port, and selects the input port for connecting the output port; and (3) a connecting portion that has a plurality of transmission parts that connect the output ports of the first switch and the input ports of the second switch.

According to another aspect of the present invention, there is provided a method of controlling a testing system that includes a plurality of test applying portions that operate a test device to make an output signal from the test device, and a plurality of testing portions that test the output of the test device; the method including the steps of: selecting and connecting the output signal to one of transmission parts each having different transmission characteristics; and testing the output signal in the testing portion, the output signal passing through the selected transmission parts.

According to yet another aspect of the present invention, there is provided a method of controlling a testing system that includes a plurality of test applying portions that operate a test device to make an output signal from the test device, and a plurality of testing portions that test the output of the test device; the method including the steps of: dividing the output signal by a branching portion; and testing the output signal in the testing portions, the output signal being output in parallel form from the branching portion.

BRIEF DESCRIPTION OF THE DRAWINGS

Exemplary embodiments of the present invention will be described in detail with reference to the following drawings, wherein:

FIG. 8 shows examples of test order information of the testing portions in accordance with the first exemplary embodiment of the present invention;

FIG. 9 shows another example of the test order information of the testing portions in accordance with the first exemplary embodiment of the present invention;

FIG. 10A and FIG. 10B are examples in which the test order information includes test priority information in accordance with the first exemplary embodiment of the present invention;

FIG. 11 shows an example of a test that is carried out in accordance with the first embodiment;

DESCRIPTION OF THE PREFERRED EMBODIMENTS

A description will now be given, with reference to the accompanying drawings, of exemplary embodiments of the present invention.

First Exemplary Embodiment

Figure 1:
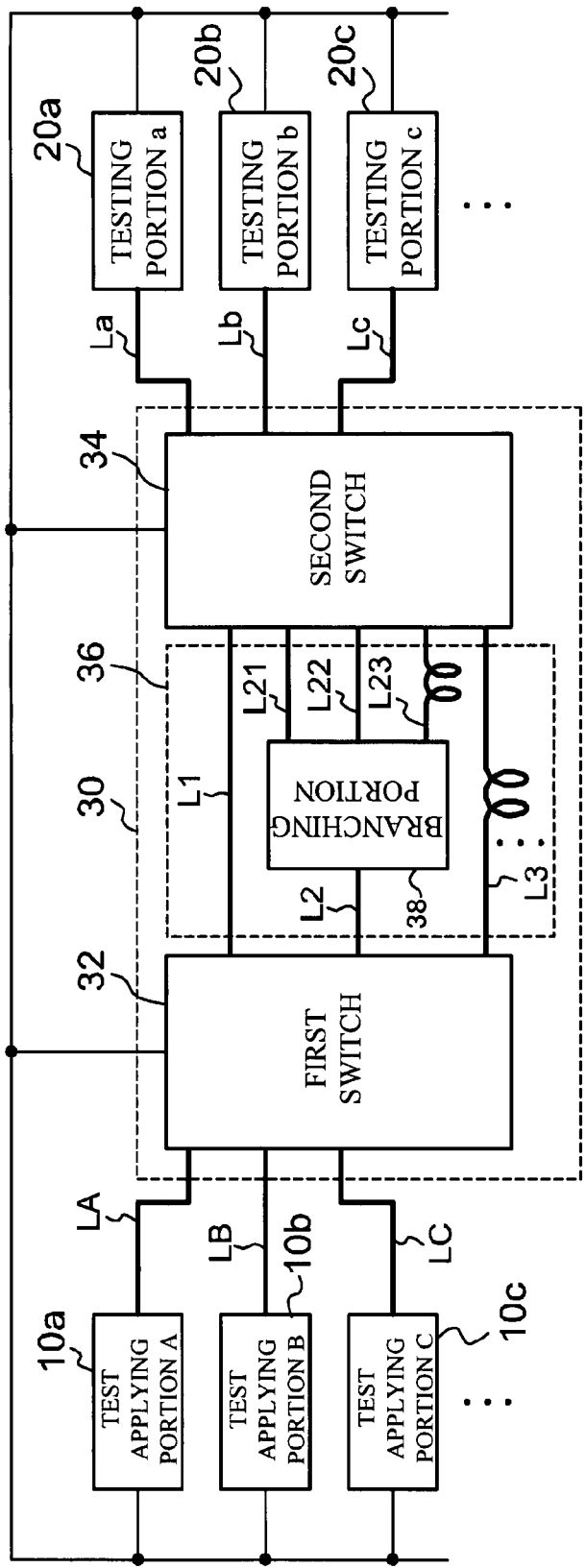
FIG. 1 shows a system configuration of a testing system in accordance with a first exemplary embodiment of the present invention.
Figure 2:
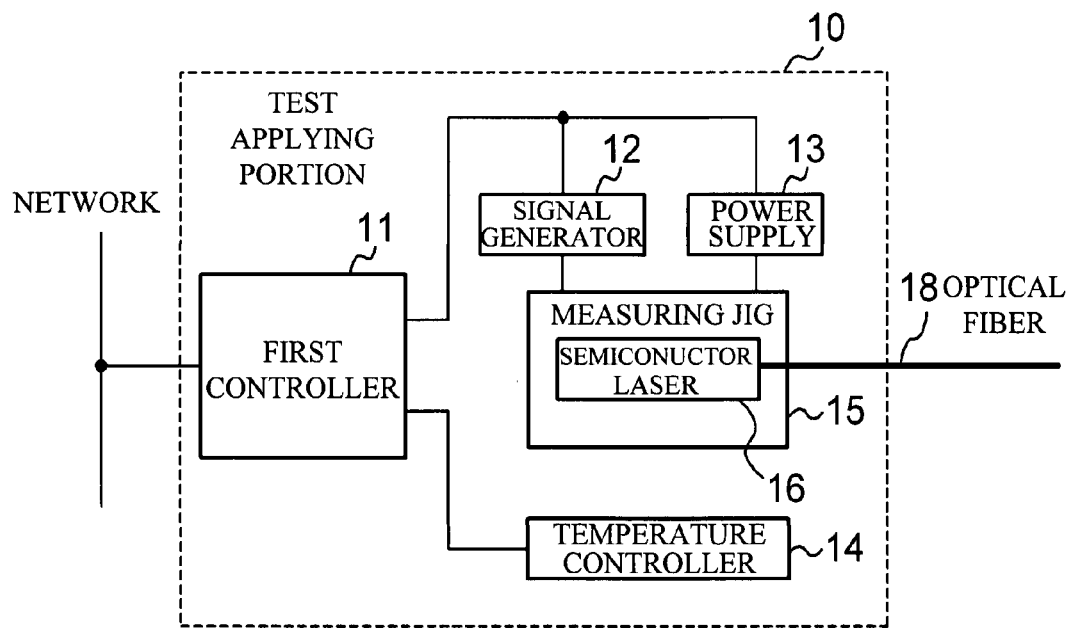
FIG. 2 is a block diagram of a test applying portion in accordance with the first exemplary embodiment of the present invention.

FIG. 1 shows a system configuration of a testing system in accordance with a first exemplary embodiment of the present invention. There are provided multiple test applying portions 10. FIG. 2 is a block diagram of the test applying portion 10. A semiconductor laser 16, which is a test device, is set at a measuring jig 15. A power supply 13 and a signal generator 12 are connected to the semiconductor laser 16. The power supply 13 outputs current and the signal generator 12 outputs an electrical signal, to the semiconductor laser 16. The semiconductor laser 16 outputs an optical signal, which is a tested signal, to an optical fiber 18. A temperature controller 14 controls the temperature of the semiconductor laser 16. A first controller 11 in the test applying portion 10 controls the signal generator 12, the power supply 13, and the temperature controller 14. The first controller 11 is made up, for example, of a personal computer, is connected to a network, and can be connected to or disconnected from the network without restarting an OA system. As stated, the test applying portion 10 includes: the first controller 11 serving as a testing portion selecting portion; the signal generator 12 that outputs an optical signal to the corresponding semiconductor laser 16; the power supply 13; and the temperature controller 14 serving as a signal outputting portion.

Figure 3:
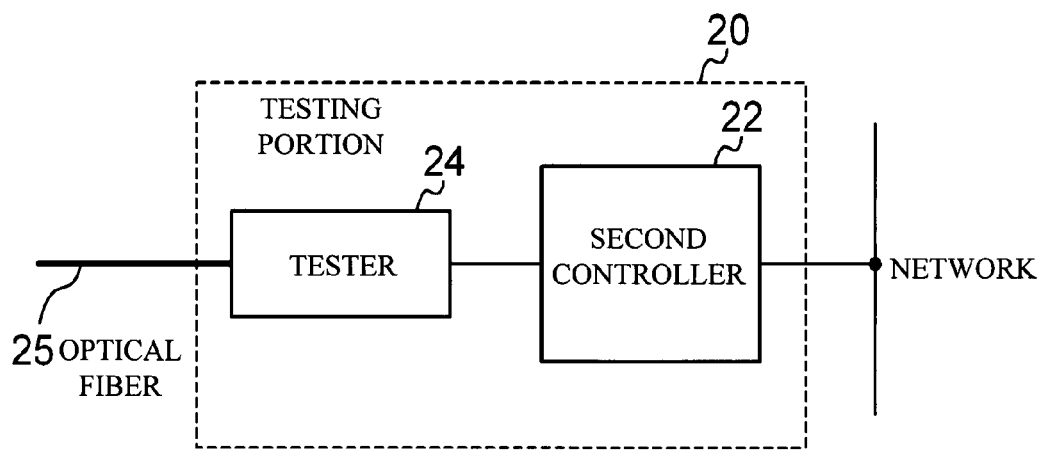
FIG. 3 is a block diagram of a testing portion in accordance with the first exemplary embodiment of the present invention.

In FIG. 1, there are provided multiple testing portions 20. FIG. 3 is a block diagram of the testing portion 20. An optical signal of the semiconductor laser 16 is input from an optical fiber 25. A tester 24 is made up, for example, of an optical power meter, optical oscilloscope, error bit measuring device, or the like, and performs a test for a test item of the semiconductor laser that corresponds to the test applying portion 10 by use of the optical signal. In this manner, the testing portion 20 performs a test for a test item of the test device or element by use of the tested signal output from the test device or element. A second controller 22 in the testing portion 20 is made up, for example, of a personal computer, is connected to a network, and can be connected to or disconnected from the network without restarting an OA system. As stated, the testing portion 20 includes: the tester 24, serving as a test performing portion, that performs a test for a test item required by the testing portion 20; and the second controller 22 serving as a test information portion. Here, the testing portion 20 may include multiple testers 24. In addition, the testing portion 20 may include a converter that converts the optical signal to the electrical signal such that the optical fiber 25 is connected to the converter and the electrical signal output from the converter is tested by the tester 24.

Referring back to FIG. 1 again, the tested signals respectively output from test applying portions 10a, 10b, and 10c respectively travel through transmission paths or parts LA, LB, and LC, and are input into a switch portion 30. The tested signal output from the switch portion 30 respectively travel through transmission paths La, Lb, and Lc, and are respectively input into testing portions 20a(a), 20b(b), and 20c(c). The switch portion 30 is an optical switch, and arbitrarily connects the transmission paths LA, LB, and LC with the transmission paths La, Lb, and Lc. The switch portion 30 connects the tested signal output from at least one of the multiple test applying portions, namely, the tested signal output from at least one of the test devices or elements, with at least one of multiple testing portions 20. The switch portion 30 includes: a first switch 32 connected to the multiple test applying portions 10; and a second switch 34 connected to the multiple testing portions 20; and a connecting portion 36 that transmits the tested signal from the first switch 32 to the second switch 34. Here, matrix switches are employed for the first switch 32 and the second switch 34.

The first switch 32 arbitrarily connects the transmission paths LA, LB, and LC with the transmission paths L1, L2, and L3 of optical fibers in the connecting portion 36. The transmission path L1 is connected to the second switch 34. The transmission path L2 is connected to a branching portion 38 that branches the optical signals. The branching portion 38 is, for example, an optical coupler that branches the optical signals into transmission paths L21, L22, and L23 of optical fibers. The transmission path L23 has a longer transmission distance than those of the transmission paths L21 and L22. That is, the transmission distances are different. The transmission path having a long transmission distance is produced by forming the transmission path with the use of, for example, a long optical fiber. The transmission paths L21, L22, and L23 are connected to the second switch 34. The transmission path L3 has a longer transmission distance than the transmission path L1. The transmission L3 is connected to the second switch 34. The second switch 34 arbitrarily connects the transmission path L1, L21, L22, L23, and L3 with the transmission path La, Lb, and Lc of optical fibers. The transmission paths La, Lb, and Lc are respectively connected to the testing portions 20a, 20b and 20c. The test applying portions 10, the testing portions 20, the first switch 32, the second switch 34 are respectively connected to a network such as a LAN or the like, the first switch 32 and the second switch 34 composing the switch portion 30.

As stated, the testing system employed in the first exemplary embodiment is provided with: the multiple test applying portions 10 that cause the semiconductor lasers 16 (test devices or elements) to emit optical signals; and the multiple testing portions 20 that perform tests for test items by use of the optical signal (tested signal) output from one of the multiple semiconductor lasers 16. In addition, the testing system further includes the switch portion 30 that connects an optical signal output from at least one of the multiple semiconductor lasers 16 to at least one of the multiple testing portions 20.

Figure 4:
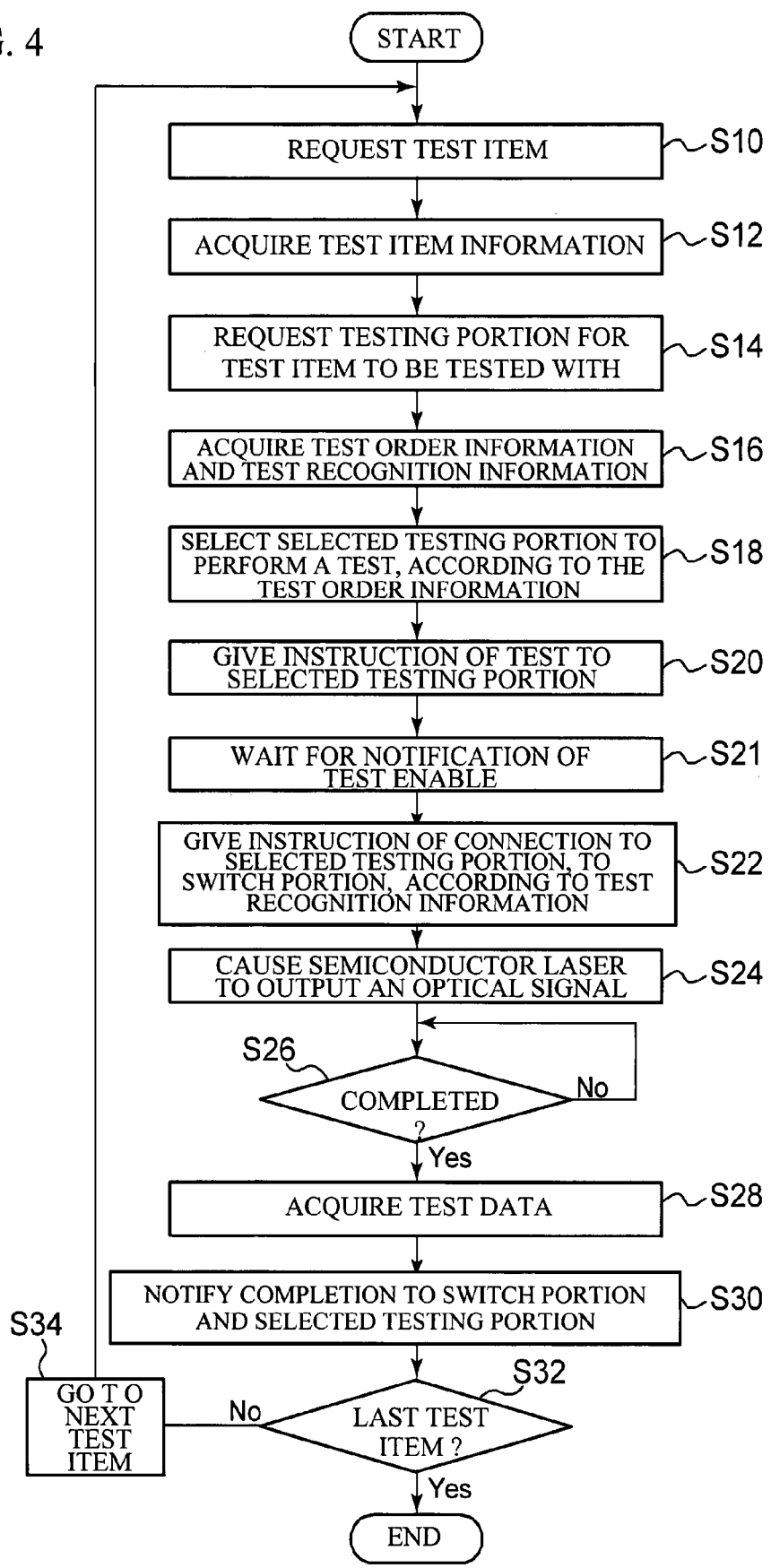
FIG. 4 shows a series of controls performed by the test applying portion in accordance with the first exemplary embodiment of the present invention.
Figure 5:
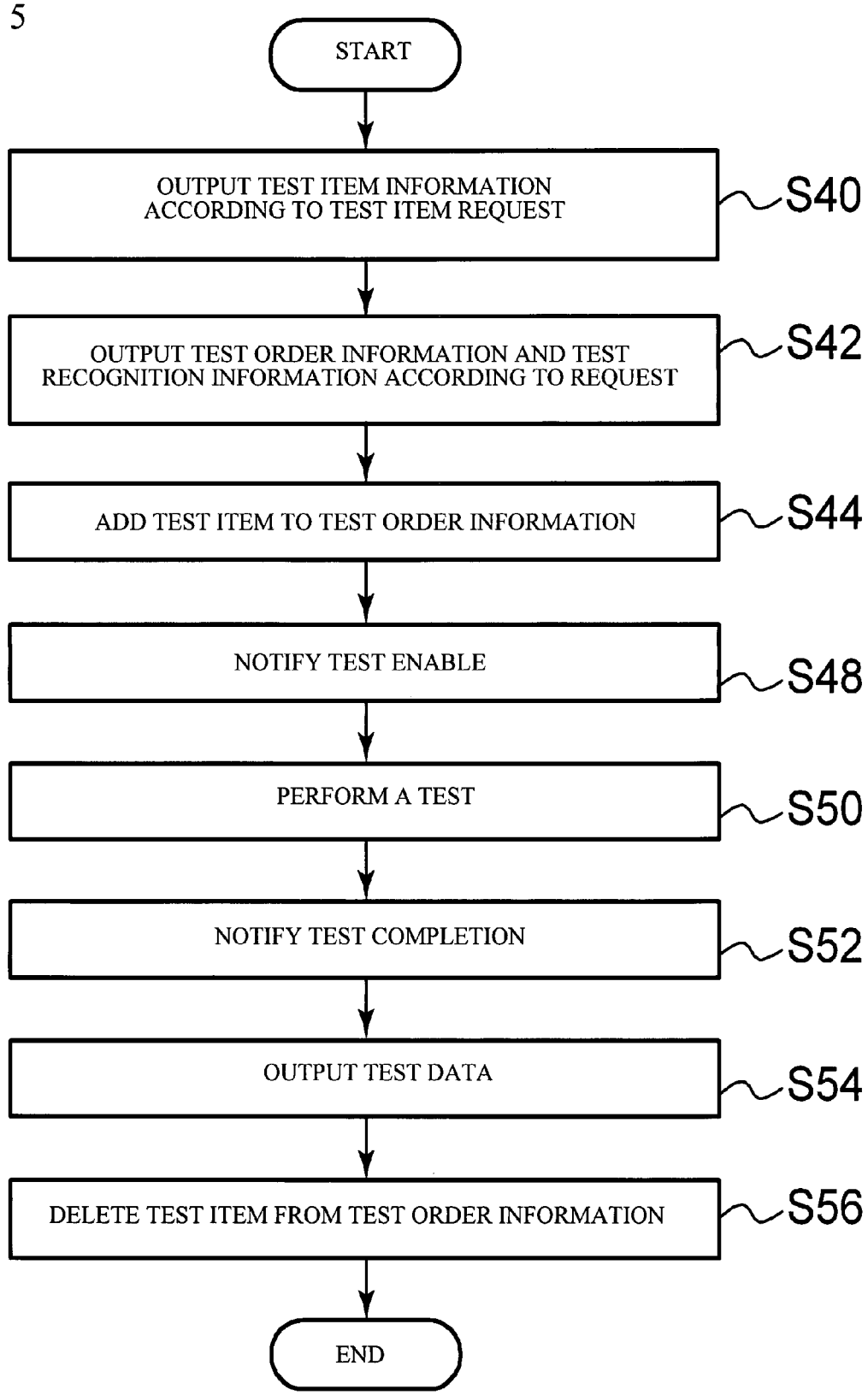
FIG. 5 shows a series of controls performed by the testing portion in accordance with the first exemplary embodiment of the present invention.
Figures 6A, 6B, 7:
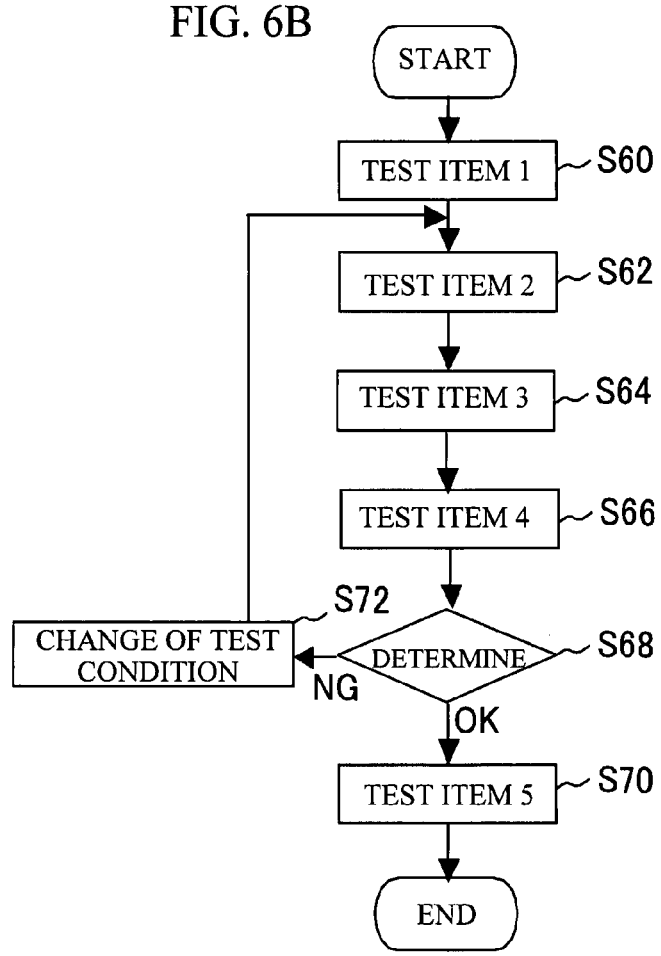
FIG. 6A shows an example of a list of test items in accordance with the first exemplary embodiment of the present invention.
FIG. 6B is a flowchart of the tests to be performed by the test applying portion in accordance with the first exemplary embodiment of the present invention.
FIG. 7 shows examples of test item information of the testing portions in accordance with the first exemplary embodiment of the present invention.

Referring to FIG. 4 and FIG. 5, a description will now be given of operations of the testing system employed in the first exemplary embodiment. A description will be given of a case where a test device or element of the test applying portion 10a(A) is tested. FIG. 4 shows a series of controls performed in the test applying portion 10a (selected test applying portion), which is one of the multiple test applying portions 10. FIG. 5 shows a series of controls performed by the testing portion 20. The first controller 11 in the test applying portion 10a includes a list of the test items. FIG. 6A shows an example of the list of the test items. In the list of the test items, there are listed test items 1, 2, and 3 corresponding to the order of the test. Also, the test applying portion 10a has a test flow as shown in, for example, FIG. 6B. According to the example of the test flow of FIG. 6B, the test item 1 through a test item 4 are performed (step S60 through S66). Next, it is determined that the test results of the test item 2 through the test item 4 satisfy a given reference (step S68). If the given reference is satisfied, a test for a test item 5 is performed (step S70) and the test result is stored and ended. At step S68, if the given reference is not satisfied, change a test condition performed by the testing portion 20, a condition of outputting an optical signal to the semiconductor laser 16, a test condition of a transmission path selected by the switch portion 30, or the like (step S72), and go back to step S62. In this manner, the test applying portion 10 may not only perform the test on the basis of the list of the test items but also perform the test again when the test condition is changed on the basis of the test result. In addition, the test item 1 through the test item 5 may be performed by an identical testing portion 20, or may be performed by different testing portions 20, respectively.

Next, a description will be given of a flow when the test is performed with one test item. Referring now to FIG. 4, the first controller 11 requests the respective testing portions 20a, 20b, and 20c for test item information that includes a test item that can be tested (step S10). The second controller 22 in the testing portion 20 includes a list of the test items that can be tested, as shown in FIG. 7. For example, the testing portion 20a is capable of performing tests for the test items 1, 2, and 3. A testing portion 20b is capable of performing tests for the test items 1, 3, and 4. A testing portion 20c is capable of performing tests for the test items 2 and 4. Referring to FIG. 5, the second controller 22 in the testing portion 20 outputs at least one test item that can be tested (test item information) to the first controller 11 in the test applying portion 10a, according to a test item request issued by the test applying portion 10a (step S40). Referring to FIG. 4, the first controller 11 in the test applying portion 10a acquires each piece of the test item information from the testing portions 20, respectively (step S12).

Referring to FIG. 4, since the testing portion 20a and the testing portion 20b, out of the testing portions 20, are capable of performing the test for the test item 1, the first controller 11 in the test applying portion 10a requests the testing portions 20a and 20b having the test item 1 that should be tested, for test order information or the like (step S14). The second controller 22 in the testing portion 20 has test order information related to the priority in the test. FIG. 4 shows an example of the test order information of the testing portion 20a and that of the testing portion 20b. The test order information includes: for example, the order of the tests to be performed; the test applying portions; and the test items. The testing portion 20a performs the test for the test item 1 of the test applying portion 10b(B) as a next test, and then performs the test for the test item 1 of the test applying portion 10c(C). The testing portion 20b performs a test for the test item 4 of the test applying portion 10c. Referring to FIG. 5, the second controller 22 in the testing portion 20a and that in the testing portion 20b output the test order information to the first controller 11 in the test applying portion 10a (step S42). At this time, the first controller 11 in the test applying portion 10a may output test recognition information to cause the switch portion 30 to connect an optical signal to a tester and test operation information that shows an operating condition of the test in the testing portion 20, or the like, to the first controller 11 in the test applying portion 10a. Also, the test recognition information and the test operation information may be output to the test applying portion 10a at another timing different from the test order information. Referring to FIG. 4 again, the first controller 11 in the test applying portion 10a acquires the test order information, the test recognition information, the test operation information, and the like, from the first controller 11 in the test applying portion 10a (step S16).

According to the test order information, the first controller 11 in the test applying portion 10a selects a selected testing portion, which is the testing portion 20 that is caused to perform the test for the test item 1 (step S18). For example, a test waiting order may be acquired as the test order information and the testing portion 20 having an earlier number may be selected. Also, a test waiting item may be acquired and a test time of the test item be considered, so that the selected testing portion may be selected. In the first exemplary embodiment, supposing that the testing portion 20b is selected. The first controller 11 in the test applying portion 10a gives an instruction of the test for the test item 1 to the testing portion 20b, which is a selected testing portion (step S20). The first controller 11 in the test applying portion 10a waits for a notification of test enable from the testing portion 20b (step S21). Referring to FIG. 5, on receiving the instruction from the test applying portion 10a, the second controller 22 in the testing portion 20b adds the test item 1 of the test applying portion 10a to the test order information (step S44), as shown in FIG. 9.

When the test for the test item 1 in the test applying portion 10a is enabled, the test enable is notified to the test applying portion 10a (step S48). Referring to FIG. 4 again, the first controller in the test applying portion 10a gives an instruction of connecting the transmission path LA, which propagates the optical signal output from the test applying portion 10a, with the transmission path Lb that corresponds to the selected testing portion 20b (step S22). The first controller 11 in the test applying portion 10a gives an instruction to the signal generator 12, the power supply 13, and the temperature controller 14 to output the optical signal, which is a tested signal, to the semiconductor laser 16, which is a test device or element (step S24). The first controller 11 in the test applying portion 10a waits for the completion of the test (step S26). Referring to FIG. 5 again, the tester 24 of the testing portion 20b performs the test for the test item 1 by use of the optical signal output from the semiconductor laser 16 corresponding to the test applying portion 10a (step S50). The second controller 22 in the testing portion 20b notifies the completion of the test to the test applying portion 10a, when the test is completed (step S52). The second controller 22 in the testing portion 20b outputs test data of the test item 1 to the test applying portion 10a (step S54).

Referring to FIG. 4 again, the first controller 11 in the test applying portion 10a acquires the test data from the testing portion 20b (step S28). The first controller 11 in the test applying portion 10a confirms whether there is anything wrong with the test data, and if not, the first controller 11 in the test applying portion 10a notifies the completion of the test to the switch portion 30 and to the testing portion 20b (step S30). Referring to FIG. 5, on receiving the notification of the completion of the test, the second controller 22 in the testing portion 20b deletes the test item 1 in the test order information of the test applying portion 10a (step S56). Referring to FIG. 4 again, the first controller 11 in the test applying portion 10a determines whether or not it is the last test item on the basis of the test item list (step S32). If it is not the last test item, processing goes to the nest test item in the test item list in FIG. 6A (step S34). If it is the last test item at step S32, the test is completed.

In the test applying portion 10a, which is a test apparatus of the testing system used in the first exemplary embodiment, the first controller 11 in the test applying portion 10a (testing portion selecting portion) acquires the test item information that shows the test items of test enable, from at least a portion, for example, the testing portions 20a and 20b, out of multiple testing portions 20. As in the step S18 of FIG. 4, the selected testing portion 20b, which is the testing portion 20 that performs the test for the test item to be tested, on the basis of the test item information. At step S22 of FIG. 4, an instruction is given to the switch portion 30 to couple the optical signal to the selected testing portion 20b. For example, the test applying portion 10a is newly connected, the first controller 11 in the test applying portion 10a does not have the information on which the testing portion 20 out of the multiple testing portions 20 should perform a test for a given test item. In the aforementioned case, the test applying portion 10a is capable of acquiring the test item information of each of the testing portions 20 and selecting the testing portion 20, in accordance with the first exemplary embodiment of the present invention. This allows the test applying portion 10a to be newly connected to the testing system, without changing the program that gives an instruction of the testing portion 20 that performs the test for the test item, to the first controller 11. In addition, when the test applying portion 10a is removed from the testing system, there is no necessity of changing the program or stopping the system, for example, so as to cause the testing portion 20 to perform the test according to which the test applying portion 10 gives the instruction. This facilitates the connection or disconnection of the test applying portion 10 to or from the testing system. Furthermore, the selected testing portion can be selected from the multiple testing portions 20 connected to the network, thereby utilizing the multiple testing portions in an effective manner.

The first controller 11 may acquire the test item information that the testing portion 20 outputs on a regular basis, without outputting the test item request. However, in the first exemplary embodiment, at step S10 of FIG. 4, the first controller 11 outputs the test item request to acquire the test item information to the testing portions 20a and 20b. At step S12, the test item information is acquired from the testing portions 20a, 20b, and 20c to correspond to the test item request. This enables the test item information to be acquired effectively.

The first controller 11 in the test applying portion 10 may select the selected testing portion on the basis of the test item information, without acquiring the test order information. However, in the first exemplary embodiment, at step S16 of FIG. 4, the first controller 11 in the test applying portion 10 acquires the test order information related to the waiting order in which the testing portions 20a and 20b perform the test. At step S18 of FIG. 4, the first controller 11 in the test applying portion 10a selects the selected testing portion 20b to be connected, on the basis of the test order information of the testing portions 20a and 20b. This makes it possible to select the testing portion 20b that can perform the test early. Here, the test order information may be the information on the order of the test in which the testing portion 20 performs. For example, the test order information may be only the operation information that shows whether another test is being currently performed.

In the testing portion 20, which is the test apparatus of the testing system employed in the first exemplary embodiment, the second controller 22 (test information portion) in the testing portion 20 outputs the test item information, which is the test item that the second controller 22 can perform, to the selected test applying portion 10a, which is one of the multiple test applying portions 10, at step S40. At step S50, the tester 24 (test performing portion) performs the test on the optical signal output from the semiconductor laser 16 that corresponds to the selected test applying portion 10a and connected to the switch portion 30, by use of the test item requested by the selected test applying portion 10a, out of the test items that can be tested. That is to say, the tester 24 performs the test on the optical signal output from the semi-conductor laser 16 selected on the basis of the test item information, by use of the corresponding test item. For example, when the testing portion 20b is newly connected to the testing system, the second controller 22 in the testing portion 20b does not have the information on the test to be performed by use of which test item out of the test items that can be tested. Even in the aforementioned case, the testing portion 20b is capable of outputting the test item information to the selected test applying portion 10a and performing the test by use of the test item requested by the selected test applying portion 10a. This allows a new testing portion 20b to be connected to the testing system, without changing the program that designates the test item by which the test is performed by the second controller 22 in the testing portion 20b. In addition, if the testing portion 20b is removed from the testing system, there is no necessity of changing the program or stopping the system of the test item information, for example, in the test applying portion 10. In this manner, the connection or disconnection of the testing portion 20 to or from is facilitated.

The second controller 22 may output the test item information to the selected testing portion on a regular basis. However, in the first exemplary embodiment, the second controller 22 in the testing portion 20 outputs the test item information according to the request issued by the selected test applying portion 10a at step S40 of FIG. 5. This makes it possible to output the test item information in an effective manner.

As shown in FIG. 8, the second controller 22 in the testing portion 20 has the test order information related to the order of the test to be performed. This enables the test items to be performed in order. Also, the test order information may be output to the test applying portion 10.

At step S42 of FIG. 5, the second controller 22 in the testing portion 20 outputs the test recognition information to connect the optical signal output from the semiconductor laser 16 corresponding to the selected test applying portion 10a, to the selected test applying portion 10a. This allows the second controller 22 in the testing portion 20 to connect the tester 24 that corresponds to the switch portion 30 with the optical signal output from the selected test applying portion 10a.

FIG. 10A and FIG. 10B are examples in which the test order information includes test priority information. FIG. 10A and FIG. 10B are views showing the test order information of the testing portion 20b. In addition to the content of the test order information, the test priority information is included to correspond to the test item of each test order. The test priority information includes two or more priority levels. In the first exemplary embodiment, two priorities of high priority and normal are included. At step S20 of FIG. 4, when the first controller 11 in the test applying portion 10a gives an instruction of the test to the testing portion 20b, the test priority information of the test items is simultaneously output. For example, when the test priority information is a high priority and the previous test item (test item 4 of the test applying portion 10c) has the priority information of normal (lower in priority), the second controller 22 in the testing portion 20b sets the test order of the test item 4 in the test applying portion 10a to earlier, according to the previous test item, as shown in FIG. 10A. That is, the priority is given to the test item 4 of the test in the test applying portion 10a. Meanwhile, when the test priority information of the previous test item is a high priority (the priority is same or higher) as shown in FIG. 10B, the priority is given to the previous test item.

As stated, the first controller 11 is capable of giving the priority to the test order thereof in the test order information of the testing portion 20b. In addition, the first controller 11 is also capable of selecting the selected testing portion on the basis of the test priority information at step S18 of FIG. 4.

FIG. 11 shows an example case where the semiconductor laser 16 is tested with the testing system in accordance with the first embodiment. First, the semiconductor laser 16 is attached to the measuring jig 15 of the test applying portion 10a (step S100). The time required for this procedure is thirty seconds. A test is then carried out on the test item 1 (step S101). This procedure is carried out, with an optical signal being connected to the tester a of the testing portion 20a. At step S18 of FIG. 4, the testing portion 20a is then selected as the selected testing portion. At step S22, the first switch 32 of the switch portion 30 selects the transmission path LA and the transmission path L1, and the second switch 34 connects the transmission path L1 and the transmission path La. In this situation, the testing portion 20a carries out a test on the test item 1 of the semiconductor laser 16, and outputs test data to the test applying portion 10a. The time required for this procedure is 25 seconds. In the same manner as at step S101, the tester a of the testing portion 20a carries out a test on the test item 2 (step S102). The time required for this procedure is 65 seconds.

The tester b of the testing portion 20b carries out a test on the test item 3 (step S103). The test item 4 that is the next test item and the test item 3 can be measured at the same time. Therefore, after step S20 of FIG. 4, the first controller 11 of the test applying portion 10a repeats the procedures of steps S10 through S20, and selects a selected testing portion to carry out the procedure of step S104. Alternatively, the first controller 11 may carry out the procedures of steps S10 through S20 so as to select steps S103 and step S104 at the same time. The tester C of the testing portion 20c is selected as the testing portion to carry out a test on the test item 4. At step S22 of FIG. 4A, the test applying portion 10a instructs the first switch 32 of the switch portion 30 to connect the transmission paths LA and L2, and the second switch 34 to connect the transmission paths L21 and Lb and to connect the transmission paths L22 and Lc. Through the above procedures, the testing portion 20b and the testing portion 20c carry out tests on the test item 3 and the test item 4 of the semiconductor laser 16 at the same time. The time required for the procedure of step S103 is 85 seconds, and the time required for the procedure of step S104 is 87 seconds. However, the procedures of step S103 and step S104 can be simultaneously carried out in 87 seconds.

A test is then carried out on the test item 5 in the same manner as at step S102 (step S105). The next procedures of steps S106, S107, and S108 can be carried out at the same time. Therefore, at step S22 of FIG. 4, the second switch 34 connects the transmission path L23 having a greater optical transmission length to a tester d different from the tester C of the testing portion 20c, as well as carrying out the procedures of steps S103 and S104. By doing so, the tests on test items at steps S106 through S108 can be carried out by three testing portions 20 at the same time. The time required for the procedures of steps S106 through S108 carried out in this manner is 112 seconds. As a result of the tests on the semiconductor laser 16 carried out in this manner, the total time required is 349 seconds. The total time required in a case where the procedures of steps S103 and S104 and the procedures of steps S106 through S108 are not carried out at the same time is 607 seconds. In this manner, the testing time can be dramatically shortened.

Figure 12A:
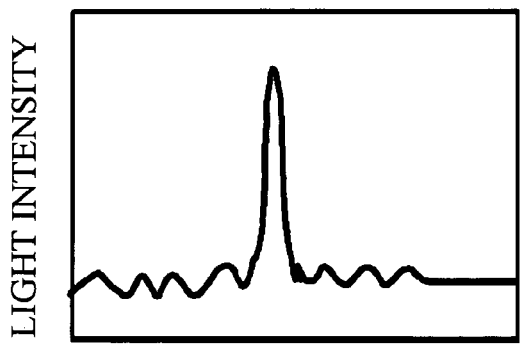
FIG. 12A through FIG. 12D show examples of tests that are carried out not in accordance with the first embodiment.
Figure 12B:
Figure 12C:
Figure 12D:
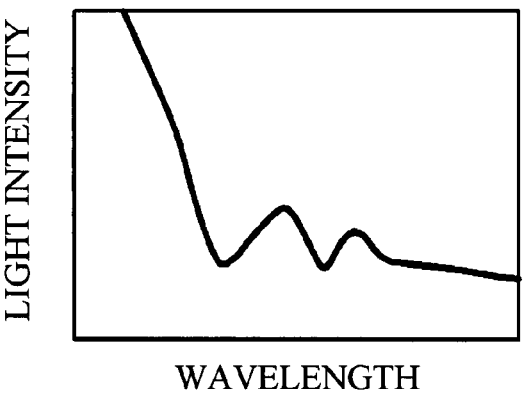

Next, another example case of tests is described. In this example case, the optical output with respect to the wavelength of an output from the semiconductor laser 16 is measured (spectrum measurement). FIG. 12A through FIG. 13B show the results of spectrum measurement in the respective wavelength ranges. In the conventional manner, the spectrum measurement in the range of the 100-nm wavelength shown in FIG. 12A, the spectrum measurement in the range of the 50-nm wavelength shown in FIG. 12B, the spectrum measurement in the range of the wavelength of 20 nm or shorter shown in FIG. 12C, and the spectrum measurement on the sides of a peak signal shown in FIG. 12D are carried out in this order.

Figure 13A:
FIG. 13A and FIG. 13B show another example of a test that is carried out in accordance with the first embodiment.
Figure 13B:
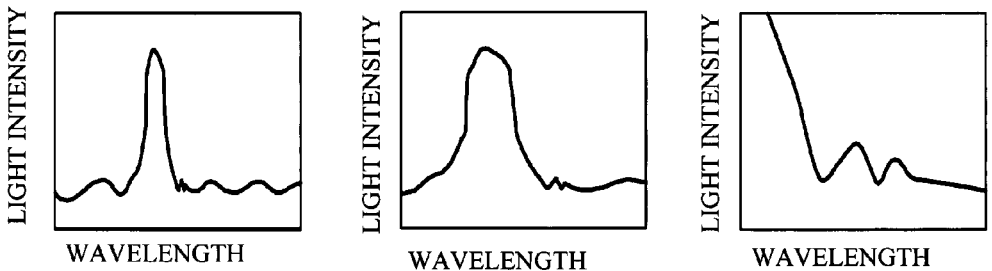
Figure 14:
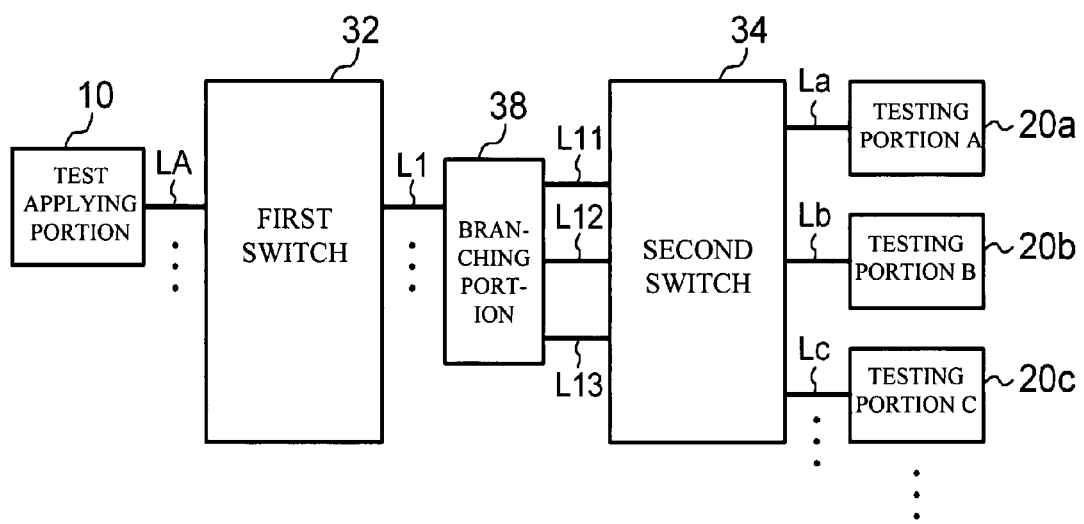
FIG. 14 is a block diagram of a testing system that carries out another example of a test in accordance with the first exemplary embodiment.

FIG. 14 is a block diagram of a testing system that carries out tests in this example case. An optical signal that is output from the semiconductor laser of the test applying portion 10 is input to the first switch 32 via the optical-fiber transmission path LA. The first switch 32 connects the transmission path LA to the transmission path L1. The branching portion 38 divides the optical signal on the transmission path L1 into the transmission paths L11, L12, and L13. The second switch 34 connects the transmission paths L11, L12, and L13 to the transmission paths La, Lb, and Lc corresponding to the testing portions 20a, 20b, and 20c that are spectrum measurement devices. With the use of such a testing system, after the spectrum measurement is carried out in the 100-nm wavelength range as shown in FIG. 13A, the spectrum measurement in the 50-nm wavelength range, the spectrum measurement in the range of the wavelength of 20 nm or shorter, and the spectrum measurement on the sides of a peak signal can be carried out at the same time, as shown in FIG. 13B. In this manner, the testing time can be shortened.

As shown in FIG. 1, the switch portion 30 of the first embodiment includes the first switch 32 that is connected to the test applying portions 10, the second switch 34 that is connected to the testing portions 20, and the connecting portion 36 that transmits optical signals from the first switch 32 to the second switch 34. The first switch 32 has input ports PA, PB, and PC that are connected to the test applying portions 10 via the transmission paths LA, LB, and LC, and output ports P1, P2, and P3 that are connected to the transmission paths L1, L2, and L3. The first switch 32 selects one of the output ports P1, P2, and P3, and connects the selected output port to one of the input ports PA, PB, and PC. The second switch 34 has output ports Pa, Pb, and Pc that are connected to the testing portions 20 via the transmission paths La, Lb, and Lc, and input ports P1, P21, P22, P23, and P3 that are connected to the transmission paths L1, L21, L22, L23, and L3. The second switch 34 selects one of the input ports P1, P21, P22, P23, and P3, and connects the selected input port to one of the output ports Pa, Pb, and Pc. The connecting portion 36 includes the transmission paths L1, L2, L21, L22, L23, and L3 that connect the output ports P1, P2, and P3 of the first switch 32 to the input ports P1, P21, P22, P23, and P3 of the second switch 34. As described with reference to FIG. 11 and FIGS. 13A and 13B, an optical signal output from one semiconductor laser 16 is divided in the connecting portion 36, and can be tested by the testing portions 20. Even in a case where the test applying portions 10 are located at a distance from the testing portions 20, the semiconductor laser 16 of each of the test applying portions 10 can be tested by the testing portions 20. Accordingly, the testing portions 20 can be efficiently used, and the testing time can be shortened.

Also, as shown in FIG. 1, in the connecting portion 36, the transmission paths L1 and L3 connected to the first switch 32 and the second switch 34 have different transmission distances from each other (or different characteristics from each other with respect to transmission). In this structure, an optical signal is input to a selected one of the transmission paths L1 and L3 having different transmission distances (or different characteristics with respect to transmission). The optical signal then passes through the selected transmission path L1 or L3, and is tested by the testing portions 20. In this manner, a signal to be tested is transmitted through the transmission path L1 or L3, so that tests can be carried out with different transmission distances between one test applying portion 10 and the testing portions 20.

The connecting portion 36 further includes the branching portion 38 that divides an optical signal output from the first switch 32, and outputs the divided signals to the second switch 34. More specifically, the branching portion 38 divides an optical signal output from the first switch 32, and inputs the divided signals in parallel to the input ports P21, P22, and P23 of the second switch 34. In this structure, an optical signal is input to the branching portion 38, as described with reference to steps S103 and S104 and steps S106 through S108 of FIG. 11. The optical signals that are output in parallel from the branching portion 38 are tested by the testing portions 20. In this manner, an optical signal that is output from one semiconductor laser 16 can be tested by the testing portions 20 at the same time. Accordingly, the testing portions 20 can be efficiently used, and the testing time can be shortened.

The connecting portion 36 further includes the transmission paths that are connected to the outputs of the branching portion 38 and have different transmission distances from one another. The optical signals that are output in parallel from the branching portion 38 pass through the transmission paths having different transmission distances, and are then input to the testing portions 20. As at steps S107 and 108 of FIG. 11, tests with different transmission distances can be carried out at the same time. The transmission paths having different characteristics from one another with respect to transmission may be formed with transmission paths made of different materials, other than transmission paths having different transmission distances. Since signals to be tested are transmitted in this manner, the transmission paths should vary the characteristics such as losses of the signals. In this manner, tests can be carried out, with the conditions for signal transmission being varied. Furthermore, tests under those conditions can be carried out at the same time.

Each signal to be tested may be an electric signal, an optical signal, or the like. Particularly, in a case where an optical signal is used, only small loss is caused when the transmission distance is long, and high resistance to noise can be achieved by virtue of the use of optical fibers. Even if the test applying portions 10 are physically at a long distance from the testing portions 20, the testing system in accordance with the first embodiment can be employed. In this manner, the testing portions 20 can be even more efficiently utilized. In a case where optical fibers are employed and the wavelength of an optical signal to be tested is in the range of the 1.3 μm band to 1.5 μm band, the loss due to the optical signal transmission can be further reduced. Also, the objects to be tested may not be semiconductor lasers, and may be light emitting elements such as light emitting diodes that output optical signals. The signal output portion of each test applying portion 10 may be the power supply 13, the signal generator 12, or the temperature controller 14. Alternatively, some other device that causes the test device to output a signal to be tested may be employed. The tester 24 of each testing portion 20 is a device that can test a tested signal that is output from an object to be tested, and may be formed with a combination of two or more devices.

In a case where a signal to be tested is an electric signal, an object to be tested should be an electronic device that outputs an analog signal or a digital signal as an electric signal. The signal output portion of each test applying portion 10 may be the power supply 13, the signal generator 12, or the temperature controller 14 that causes an electronic device to output an electric signal. The tester 24 of each testing portion 20 may be a tester that tests an electric signal. The branching portion 38 may be a divider that divides an electric signal, and the transmission paths may be formed with electric cables.

Second Exemplary Embodiment

Figure 15:
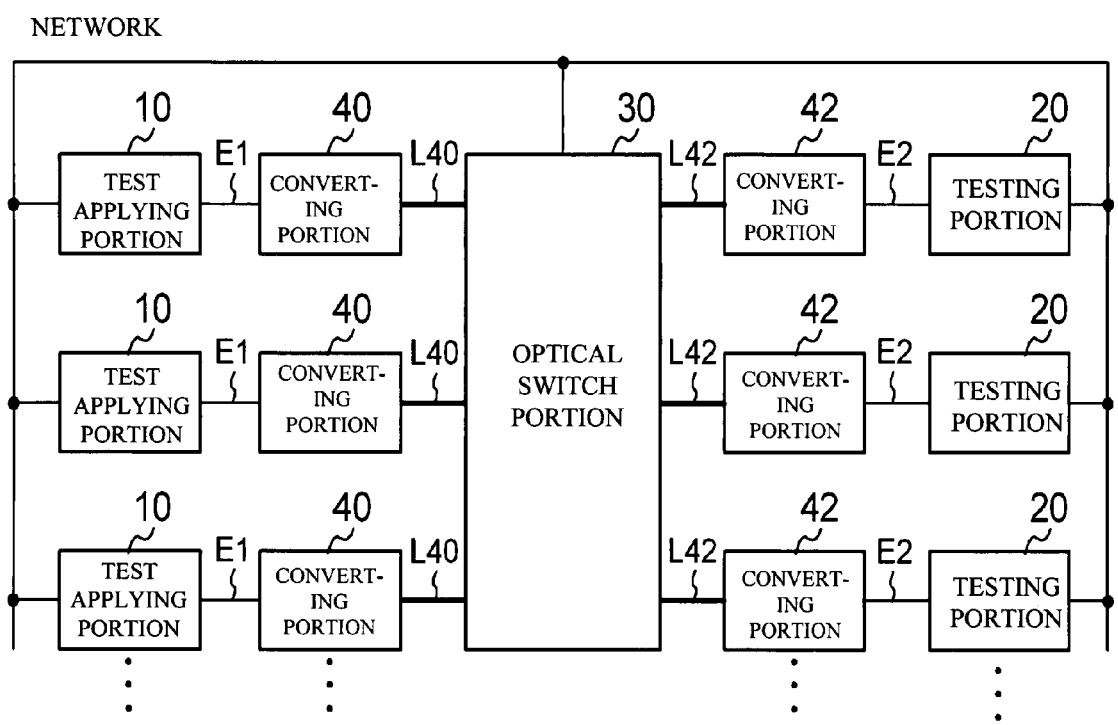
FIG. 15 is a block diagram of a testing system in accordance with a second exemplary embodiment of the present invention.

A second embodiment of the present invention is an example case where an electric signal that is output from the test device of the test applying portion 10 is converted into an optical signal, is converted back into an electric signal after switching by the switch portion 30, and is input to the testing portions 20. Referring now to FIG. 15, each test applying portion 10 has a test device that outputs a first electric signal. Each test device may be an electric device that outputs electric signals as digital signals. Each test applying portion 10 has a signal output portion that supplies power and signals to the electronic device, and causes the electronic device to output the first electric signal. The first electric signal E1 that is output from the test device of the test applying portion 10 is input to a first converting portion 40 via electric cables such as coaxial cables. The first converting portion 40 converts the first electric signal E1 into an optical signal L40. As in the first embodiment, the switch portion 30 connects the optical signal L40 from at least one of the test devices of the test applying portions 10 to at least one of the testing portions 20. A second converting portion 42 converts an optical signal L42 that is output from the switch portion 30 into a second electric signal E2. Using the second electric signal E2, the testing portions 20 test the test devices of the test applying portions 10.

In the second embodiment, each electric signal that is a signal to be tested is converted into an optical signal, and is then converted ant transmitted to the testing portions 20. In a case where the transmission distance is long, an optical signal has smaller loss and exhibits higher resistance to noise than an electric signal. Because of this, the testing portions 20 located physically at a long distance from the test applying portions 10 can carry out tests. Thus, the testing portions 20 can be efficiently used. The switch portion 30 may include the first switch 32, the second switch 34, and the connecting portion 36, as in the first embodiment. Also, the testing system in accordance with the second embodiment may be controlled in the same manner as illustrated in FIG. 4 and FIG. 5 showing the control operation of the first embodiment.

Finally, various aspects of the present invention are summarized in the following.

There is provided a testing system including: a plurality of test applying portions that operate a test device to make an output signal from the test device; a plurality of testing portions that test the output of the test device; and a test applying portion having a test device to output a tested signal; and a switch portion that switches the output signal between the test applying portions and the testing portions, the switch portion including: (1) a first switch having an input port and a plurality of output ports, and selects the output port for connecting the input port; (2) a second switch having a plurality of input ports and an output port, and selects the input port for connecting the output port; and (3) a connecting portion that has a plurality of transmission parts that connect the output ports of the first switch and the input ports of the second switch.

In the above-described testing system, the transmission parts of the connecting portion may have different characteristics from one another with respect to transmission, and may be connected to the first switch and the second switch. In this structure, the first switch and the second switch are used so that a signal to be tested is transmitted through different transmission parts. Thus, tests can be carried out with different transmission lengths between the test applying portion and the testing portion.

In the above-described testing system, the connecting portion may include a branching portion that divides a tested signal that is output from the first switch, and inputs the divided signals in parallel to the input ports of the second switch. In this structure, a tested signal that is output from one test device can be tested by more than one testing portion at the same time. Thus, the testing time can be shortened.

In the above-described testing system, the connecting portion may include transmission parts that are connected to outputs of the branching portion, and may have different characteristics from one another with respect to transmission. In this structure, tests with different transmission lengths can be carried out at the same time.

The above-described testing system may further include a plurality of testing portions that simultaneously test the output signal output the test device. With this structure, the testing time can be made even shorter.

In the above-described testing system, the test applying portion may include a testing portion selecting portion that obtains test item information indicating test items on which tests can be carried out by the testing portion, may select the testing portion to carry out tests in accordance with the test item information, and may output an instruction to cause the switch portion to connect the tested signal to the selected testing portion. With this structure, it is not necessary to make a change to the program or to stop the entire system, when a new test applying portion is connected to the testing system or a test applying portion is disconnected from the testing system. Accordingly, a test applying portion can be easily connected to or disconnected from the testing system. Thus, the productivity can be increased, without a decrease in operation rate.

In the above-described testing system, the testing portion may include a test information portion that outputs test item information indicating test items on which the testing portion can carry out tests, and a test conducting portion that tests the tested signal on the test items, the tested signal being transmitted from the test device selected in accordance with the test item information. With this structure, it is not necessary to make a change to the program or to stop the entire system, when a new test applying portion is connected to the testing system or a test applying portion is disconnected from the testing system. Accordingly, a test applying portion can be easily connected to or disconnected from the testing system. Thus, the productivity can be increased, without a decrease in operation rate.

The above-described testing system may include: a test applying portion that has a test device to output a first electric signal; a first converting portion that converts the first electric signal into an optical signal; a switch portion that connects an optical signal transmitted from at least one of test devices to at least one of testing portions; a second converting portion that converts the optical signal into a second electric signal; and a testing portion that carries out a test on test items of the test device, using the second electric signal. In accordance with this invention, test portions located physically at a long distance from test applying portions can be used for tests, since an optical signal transmitted over a long transmission distance has smaller loss and exhibits higher resistance to noise than an electric signal. Thus, the testing portions can be more efficiently used.

In the above-described testing system, the switch portion may include: a first switch that has an input port connected to the test applying portion, and selects and connects one of output ports to the input port; a second switch that has an output port connected to the testing portion, and selects and connects one of input ports to the output port; and a connecting portion that has transmission parts connecting the output ports of the first switch and the input ports of the second switch.

There is provided a method of controlling a testing system that includes a plurality of test applying portions that operate a test device to make an output signal from the test device, and a plurality of testing portions that test the output of the test device; the method including the steps of: selecting and connecting the output signal to one of transmission parts each having different transmission characteristics; and testing the output signal in the testing portion, the output signal passing through the selected transmission parts.

There is also provided a method of controlling a testing system that includes a plurality of test applying portions that operate a test device to make an output signal from the test device, and a plurality of testing portions that test the output of the test device; the method including the steps of: dividing the output signal by a branching portion; and testing the output signal in the testing portions, the output signal being output in parallel form from the branching portion.

In the above-described method, the tested signals that are output in parallel from the branching portion may be input to the testing portions through transmission parts having different characteristics from one another with respect to transmission.

Although a few specific exemplary embodiments employed in the present invention have been shown and described, it would be appreciated by those skilled in the art that changes may be made in these exemplary embodiments without departing from the principles and spirit of the invention, the scope of which is defined in the claims and their equivalents.

The present invention is based on Japanese Patent Application No. 2006-101122 filed on Mar. 31, 2006, the entire disclosure of which is hereby incorporated by reference.

What is claimed is:

1. A testing system comprising:
    a plurality of test applying portions, each test applying portion having a test device that generates an output signal in response to the test applying portion;
    a plurality of testing portions, each testing portion testing the output of the test device; and
    a switch portion that switches the output signal of the test device between the test applying portions and the testing portions, the switch portion including:
    (1) a first switch being a matrix switch, having an input port connected to one of the test applying portions and a plurality of output ports, and selecting one of the output ports for connecting the input port;
    (2) a second switch being a matrix switch, having a plurality of input ports and an output port connected to one of the testing portions, and selecting one of the input ports for connecting the output port; and
    (3) a connecting portion that has a plurality of transmission parts that connect the output ports of the first switch and the input ports of the second switch,
    the output signal of the test device being supplied to said one of the testing portions passing through the first switch, the connecting portion and the second switch.

2. The testing system as claimed in claim 1, wherein the transmission parts of the connecting portion have different characteristics from one another with respect to transmission, and are connected to the first switch and the second switch.

3. The testing system as claimed in claim 1, wherein the connecting portion includes a branching portion that divides a tested signal that is output from the first switch, and inputs the divided signals in parallel to the input ports of the second switch.

4. The testing system as claimed in claim 3, wherein the connecting portion includes transmission parts that are connected to outputs of the branching portion, and have different characteristics from one another with respect to transmission.

5. The testing system as claimed in claim 1, further comprising a plurality of testing portions that simultaneously test the output signal from the test device.

6. The testing system as claimed in claim 1, wherein the test applying portion includes a testing portion selecting portion that obtains test item information indicating test items on which tests can be carried out by the testing portion, selects the testing portion to carry out tests in accordance with the test item information, and outputs an instruction to cause the switch portion to connect the tested signal to the selected testing portion.

7. The testing system as claimed in claim 1, wherein the testing portion includes a test information portion that outputs test item information indicating test items on which the testing portion can carry out tests, and a test conducting portion that tests the tested signal on the test items, the tested signal being transmitted from the test device selected in accordance with the test item information.

* * * * *